United States Patent
Akiyama

(10) Patent No.: US 9,466,796 B2
(45) Date of Patent: Oct. 11, 2016

(54) ELECTRONIC DEVICE HAVING THIN FILM TRANSISTOR USING ORGANIC SEMICONDUCTOR AND METHOD OF MANUFACTURING THE SAME

(71) Applicant: KABUSHIKI KAISHA TOSHIBA, Minato-ku, Tokyo (JP)

(72) Inventor: Masahiko Akiyama, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/658,563

(22) Filed: Mar. 16, 2015

(65) Prior Publication Data

US 2015/0270488 A1  Sep. 24, 2015

(30) Foreign Application Priority Data

Mar. 19, 2014  (JP) ................................ 2014-057008

(51) Int. Cl.
*H01L 51/00* (2006.01)
*H01L 51/05* (2006.01)

(52) U.S. Cl.
CPC ......... *H01L 51/0022* (2013.01); *H01L 51/055* (2013.01); *H01L 51/0529* (2013.01); *C08G 2261/51* (2013.01); *C08G 2261/92* (2013.01); *H01L 51/0035* (2013.01); *H01L 51/0541* (2013.01)

(58) Field of Classification Search
CPC ............. H01L 51/0022; H01L 51/055; H01L 51/0529; H01L 51/0541; H01L 51/0035; C08G 2261/92; C08G 2261/51
See application file for complete search history.

(56) References Cited

U.S. PATENT DOCUMENTS

| 8,426,848 B2 | 4/2013 | Mueller et al. |
| 2005/0202348 A1* | 9/2005 | Nakayama .......... H01L 51/0096 430/311 |
| 2006/0024957 A1 | 2/2006 | Harada et al. |
| 2007/0249122 A1 | 10/2007 | Seo et al. |

(Continued)

FOREIGN PATENT DOCUMENTS

| JP | 2006-41180 | 2/2006 |
| JP | 2007-294851 | 11/2007 |
| JP | 2010-123844 | 6/2010 |

(Continued)

OTHER PUBLICATIONS

Extended European Search Report mailed by the European Patent Office, on Oct. 6, 2015, in counterpart European Patent Application No. 15156921.7 (8 pages).

*Primary Examiner* — John P Dulka
(74) *Attorney, Agent, or Firm* — Finnegan, Henderson, Farabow, Garrett & Dunner, LLP

(57) ABSTRACT

According to one embodiment, there is provided a manufacturing method of an electronic device including a lower electrode, a source electrode and a drain electrode made of a nanoparticulate conductive material on a substrate, an organic semiconductor layer between the source and drain electrodes, and a gate electrode on the organic semiconductor layer via a gate insulating layer. The manufacturing method includes forming a nonphotosensitive resin layer as the gate insulating layer on the organic semiconductor layer and on the lower electrode, forming a photosensitive resin layer as the gate insulating layer on the nonphotosensitive resin layer, and forming a through hole in the photosensitive resin layer on the lower electrode.

15 Claims, 10 Drawing Sheets

(56) References Cited

U.S. PATENT DOCUMENTS

2013/0075734 A1* 3/2013 Cain .................. H01L 51/0022
257/57
2013/0075761 A1 3/2013 Akiyama

FOREIGN PATENT DOCUMENTS

| JP | 2010-135584 | 6/2010 |
| JP | 2011-222780 | 11/2011 |
| JP | 2013-73965 | 4/2013 |

* cited by examiner

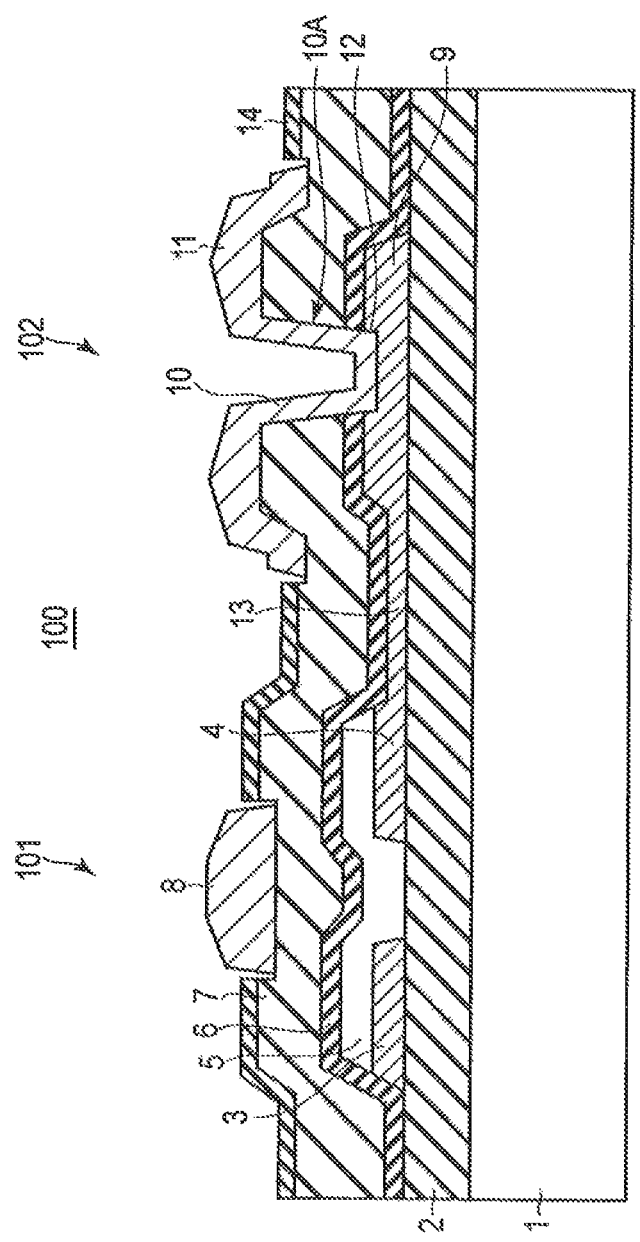
F I G. 1

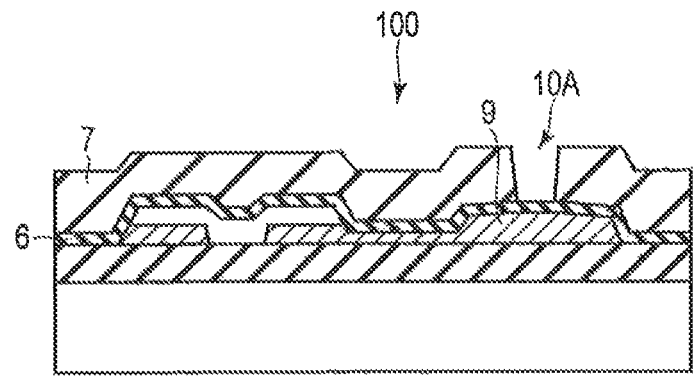
F I G. 10A
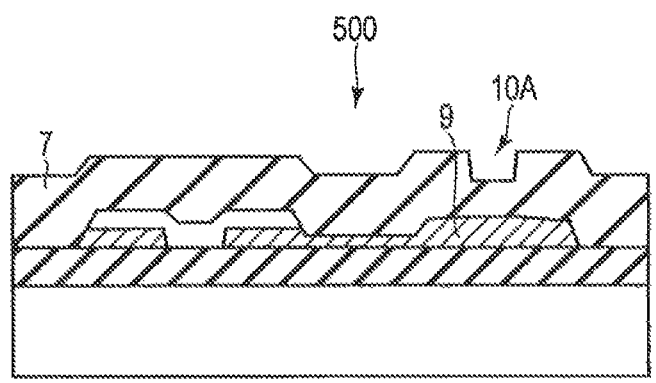
F I G. 10B

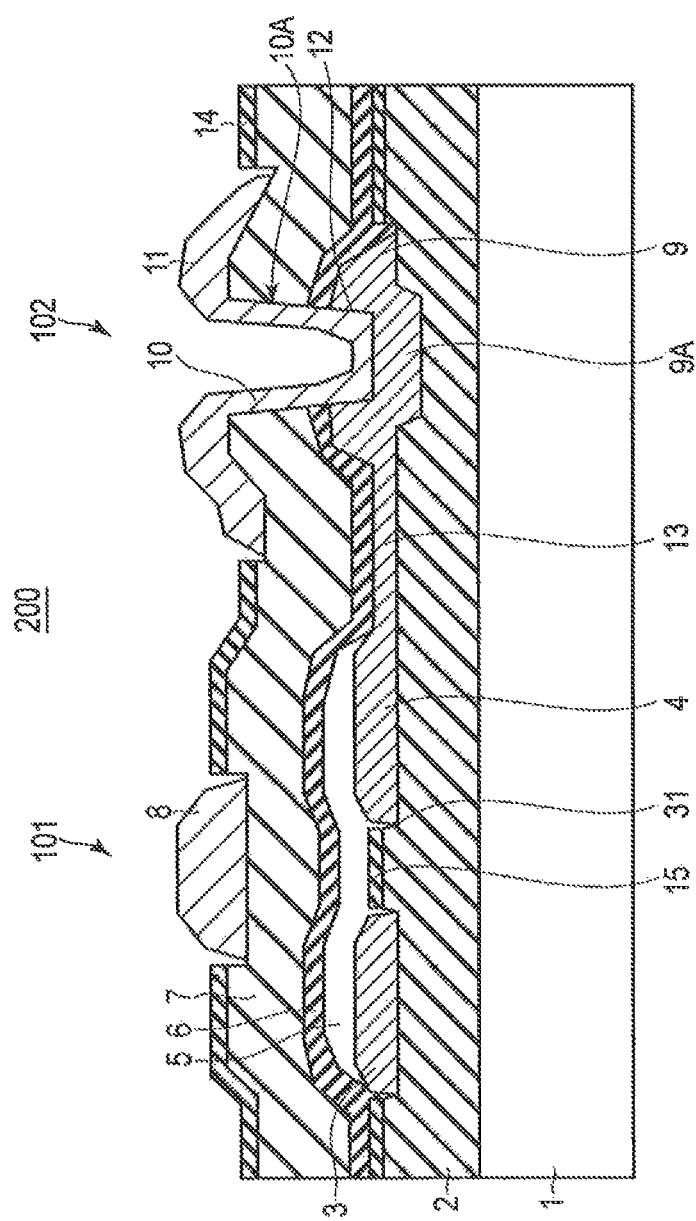
F I G. 11

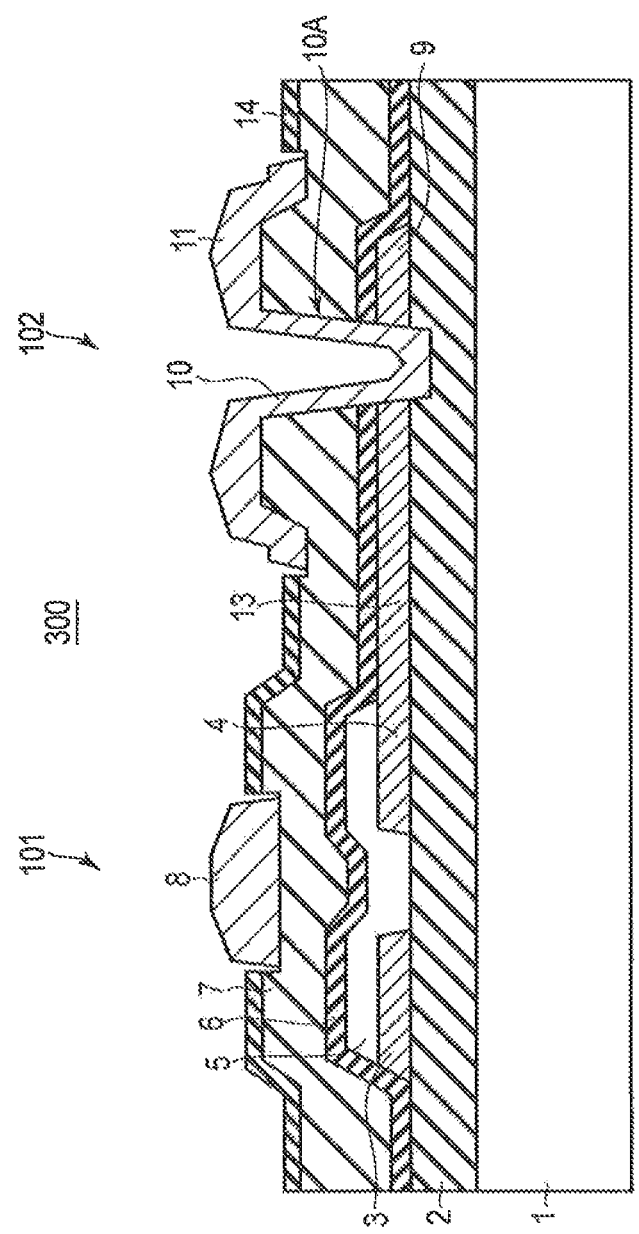
F I G. 12

ELECTRONIC DEVICE HAVING THIN FILM TRANSISTOR USING ORGANIC SEMICONDUCTOR AND METHOD OF MANUFACTURING THE SAME

CROSS-REFERENCE TO RELATED APPLICATIONS

This application is based upon and claims the benefit of priority from Japanese Patent Application No. 2014-057008, filed Mar. 19, 2014, the entire contents of which are incorporated herein by reference.

FIELD

Embodiments described herein relate generally to an electronic device having a thin film transistor using an organic semiconductor and a manufacturing method of the electronic device.

BACKGROUND

As a system in which an electronic device is formed on a substrate having a large area, it is known that a thin film transistor (TFT) is formed on the substrate to constitute an active matrix, a circuit and the like. In particular, it is expected that patterns of electrodes, semiconductors and the like are formed using printing technology by using an organic semiconductor, whereby an electronic device can be formed at a low temperature on a flexible substrate at low cost.

As a structure of an organic thin film transistor, a top gate bottom contact structure made by forming source and drain electrodes in a lower layer, forming a semiconductor layer thereon, forming a gate insulating layer, and further forming a gate electrode is a stagger structure where the gate electrode as well as the source and drain electrodes are arranged via the semiconductor, and hence it is considered that TFT characteristics are easily obtained.

When liquid crystals, electrophoretic particles, organic EL materials and the like are driven by an active matrix, it is necessary for the gate insulating layer to be opened and electrical connection made between the layers to one another, because the source and drain electrodes are present under the gate insulating layer in the top gate bottom contact structure. Furthermore, when an electronic circuit such as a shift register is formed, it is necessary to connect the gate electrode to the source and drain electrodes, and formation of a through hole in the gate insulating layer and the interlayer connection are required.

Examples of a method of forming the through hole in the insulating layer include a so-called lithography method in which a resist is exposed and developed and the layer is processed by using the resist as a mask, and a method in which a solvent is supplied by a needle or the like to locally dissolve the insulating layer, thereby accomplishing connection.

However, the lithography method has the problem that steps are complicated, which increases cost. In a technique described in the lithography method, a gate insulating layer is subjected to RIE (reactive ion etching) processing by use of a gate electrode as a mask, and hence it is necessary to form another electrode layer for the purpose of connecting a gate electrode layer to source and drain electrode layers. Furthermore, an edge portion of the gate electrode is common with a pattern edge of the gate insulating layer, and hence there is a problem in insulating properties between the gate electrode and the source and drain electrodes. Therefore, a countermeasure such as attachment of an additional insulating layer to cover a side surface is required. Furthermore, in the method where the solvent is supplied by the needle to dissolve the insulating layer, there is the problem that a fine opening cannot be made, and hence the method can only be applied to a rough pattern of a display section periphery or the like.

BRIEF DESCRIPTION OF THE DRAWING

FIG. 1 is a sectional view of an electronic device of a first embodiment;

FIG. 10A is a sectional view of a case where a through hole is formed in the first embodiment;

FIG. 10B is a sectional view of a case where a through hole is formed in the comparative example;

FIG. 11 is a sectional view of an electronic device of a second embodiment; and

FIG. 12 is a sectional view of an electronic device of a third embodiment.

DETAILED DESCRIPTION

Figure 2A:
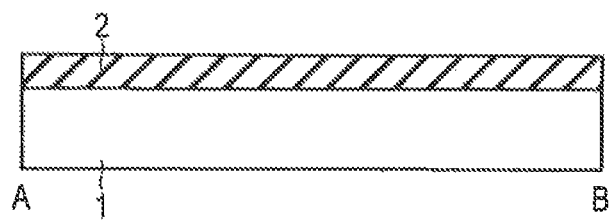
FIGS. 2A, 2C and 2E are sectional views of a manufacturing method of the electronic device.

In general, according to one embodiment, there is provided a manufacturing method of an electronic device comprising a lower electrode, a source electrode and a drain electrode made of a nanoparticulate conductive material on a substrate, an organic semiconductor layer between the source electrode and the drain electrode, and a gate electrode on the organic semiconductor layer via a gate insulating layer. The manufacturing method of the electronic device comprises forming a non-photosensitive resin layer as the gate insulating layer on the organic semiconductor layer and on the lower electrode, forming a photosensitive resin layer as the gate insulating layer on the non-photosensitive resin layer, and forming a through hole in the photosensitive resin layer on the lower electrode.

Hereinafter, embodiments will be described with reference to the drawings. It is to be noted that in the following description, constitutional elements having the same function and constitution are denoted with common reference symbols.

First Embodiment

FIG. 1 is a sectional view of an electronic device of the first embodiment.

An electronic device 100 of the first embodiment comprises a thin film transistor 101 and an interlayer connecting section 102 formed on a substrate 1. The interlayer connecting section 102 is connected to the thin film transistor 101. The substrate 1 is made of, for example, glass or a plastic film.

A resin layer 2 is formed on the substrate 1, and a source electrode 3, a drain electrode 4 and a lower electrode 9 are formed on the resin layer 2. The source electrode 3, the drain electrode 4 and the lower electrode 9 are made of a nanoparticulate conductive material. For example, as the nanoparticulate conductive material, nanoparticles of Ag, Cu, Au or the like are applicable. On the substrate 1, a connecting wiring line 13 electrically connecting the drain electrode 4 to the lower electrode 9 is formed. The connecting wiring line 13 may be made of the same nanoparticulate conductive material as the source electrode 3, the drain electrode 4 and the lower electrode 9. For respective film thicknesses of the source electrode 3, the drain electrode 4 and the lower electrode 9, the lower electrode 9 preferably has a larger film thickness than the source electrode 3 and the drain electrode 4.

A semiconductor layer 5 is formed on the source electrode 3, on the drain electrode 4 and between the source electrode 3 and the drain electrode 4. The semiconductor layer 5 is suitably made of an organic semiconductor, but may be made of an organic-inorganic mixed material or the like. The organic semiconductor may be low molecular, high molecular, or a low and high molecular blend. Here, as the semiconductor layer 5, a polymer-based organic material was used.

On the semiconductor layer 5, a first gate insulating layer 6 to cover the semiconductor layer 5 is formed. In the first gate insulating layer 6, a non-photosensitive resin is used. As the non-photosensitive resin, a material having a dielectric constant of 2 to 3 and especially having low polarization components (polar groups) is preferable. Here, as the non-photosensitive resin, a polystyrene-based resin, a partial fluorine-based resin or the like is used. In particular, when a material which does not include a photoacid generator is used as the non-photosensitive resin, the insulating layer can be formed so that the TFT is excellent in electrical characteristics, interface characteristics, barrier characteristics and the like. The photoacid generator generates an acid when irradiated with light. The barrier characteristics mean that diffusion of the material or the like is cut off between the semiconductor layer 5 and the gate insulating layer.

On the first gate insulating layer 6, a second gate insulating layer 7 is formed. In the second gate insulating layer 7, a photosensitive resin is used. The photosensitive resin is especially suitably a chemical amplification type of photosensitive resin which reacts with the acid generated by the photoacid generator in a light irradiated portion to change its solubility. When the chemical amplification type of photosensitive resin is used, a highly-sensitive fine pattern can be formed. The photoacid generator including at least one of triarylsulfonium salt series, naphthalene imide series, thioxanthone derivatives, triazines, nitrobenzylesters, diazomethanes and onium salts is usable. The photosensitive resin is preferably a positive type, but may be a negative type. In the case of a device whose resolution may be low, a photocurable resin may be used as the photosensitive resin. When the photocurable resin is used, a non-curing portion is removed with a solvent to form the pattern.

On the second gate insulating layer 7, a gate electrode 8 is formed. The gate electrode 8 is preferably made of a nanoparticulate conductive material.

In the interlayer connecting section 102, the first gate insulating layer 6 is formed on the lower electrode 9 and the second gate insulating layer 7 is formed on the first gate insulating layer 6. In the first gate insulating layer 6 and the second gate insulating layer 7 on the lower electrode 9, a through hole 10A is formed, and a through hole conductive film 10 is formed in the through hole 10A. On the second gate insulating layer 7, an upper electrode 11 is formed. The upper electrode 11 is electrically connected to the lower electrode 9 via the through hole conductive film 10. The upper electrode 11 is preferably made of a nanoparticulate conductive material.

In the first embodiment, according to a structure where the first gate insulating layer 6 is interposed between the lower electrode 9 and the second gate insulating layer 7, even when the nanoparticulate conductive material suitable for printing is used in the lower electrode 9 (as well as the source electrode 3 and the drain electrode 4), the lower electrode 9 can suitably be brought into contact with the through hole conductive film 10 and further, the characteristics of the TFT can suitably be maintained.

According to the abovementioned top gate bottom contact structure, carriers are accumulated in the semiconductor layer 5 on the source electrode 3 by a gate electric field to promote injection of the carriers from the source electrode 3, thereby decreasing an electric contact resistance and increasing an on-current, so that improvement in the TFT characteristics can be obtained. In particular, the organic semiconductor is used as the semiconductor layer 5, hence the contact resistance easily increases, thus a stagger structure may be used to stably improve the TFT characteristics. The gate insulating layer (the non-photosensitive resin) 6 is interposed between the semiconductor layer (the organic semiconductor) 5 and the gate insulating layer (the photosensitive resin) 7, to improve the characteristics (a trap level, etc.) of an interface between the semiconductor layer 5 and the gate insulating layer 6 and to inhibit an influence of a component which imparts a photosensitivity in the photosensitive resin from being exerted on the interface between the organic semiconductor and the gate insulating layer as well as the organic semiconductor, so that a performance can be improved.

Next, to describe a constitution and an effect of the first embodiment in detail, manufacturing steps of the electronic device of the first embodiment will be described in detail. FIGS. 2A to 2F, 3A to 3F, 4A to 4F, 5A to 5D and 6A to 6D show sectional views and plan views of the manufacturing method to realize the structure of the electronic device. It is to be noted that each sectional view shows a cross section taken along the A-B line of each plan view.

Figure 2B:
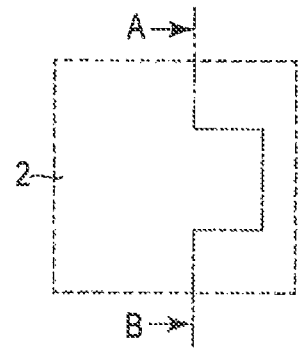
FIGS. 2B, 2D and 2F are plan views corresponding to the sectional views.

As shown in FIGS. 2A and 2B, the resin layer 2 is formed on the substrate 1 made of glass, plastic film or the like. The resin layer 2 may be formed by applying a resin onto the substrate 1 and curing the resin. The resin layer 2 is preferably excellent in electrical characteristics and surface smoothness, and is preferably made of a material suitable for formation of a later-mentioned lyophobic/lyophilic pattern. Here, the same polystyrene-based resin as the later-mentioned non-photosensitive resin was used. Additionally, polyimide or the like is usable. When a substrate material is polyimide or the like, the resin layer can be omitted.

Figure 2C:
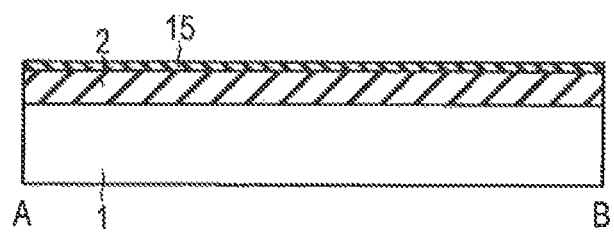
Figure 2D:
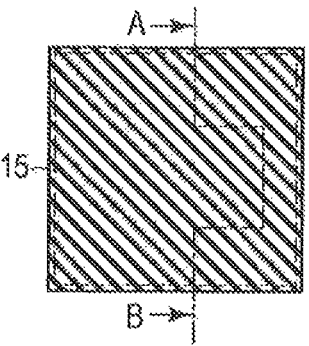

Next, as shown in FIGS. 2C and 2D, a lyophobic layer 15 is formed on the resin layer 2. The lyophobic layer 15 has a large contact angle to later-mentioned conductive inks 18 and 19, and the layer having an angle of 70 degrees or more is used. The lyophobic layer 15 is suitably a fluorine-based lyophobic layer obtained by subjecting a fluorine-containing gas to discharge decomposition to form a lyophobic layer on the resin layer 2. As the fluorine-containing gas, fluorocarbon is preferable, and $CF_4$, $C_4F_8$ or the like is usable. The lyophobic layer having a water contact angle of 95 degrees or more is obtained. Furthermore, $CHF_3$ or the like is usable as the fluorine-containing gas. The lyophobic layer 15 may be formed by using plasma, or may be formed by applying a solution of a fluorine-containing material. Furthermore, an amorphous fluorine resin can be utilized as the lyophobic layer 15.

Figure 2E:
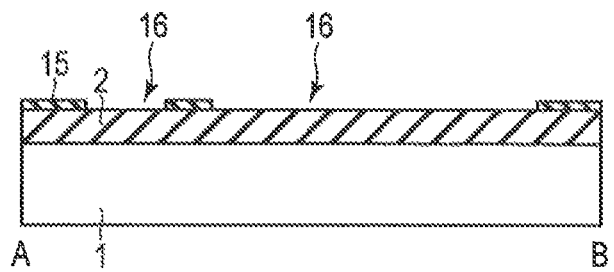
Figure 2F:
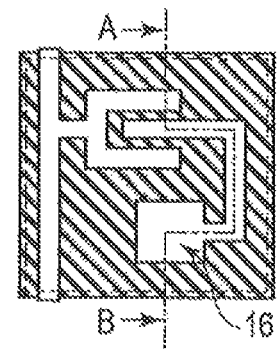

The fluorine-containing lyophobic layer 15 is formed, and then, as shown in FIGS. 2E and 2F, the lyophobic layer of a portion onto which the conductive ink is to be applied is removed. The lyophobic layer which is present in a pattern 16 where the source electrode 3, the drain electrode 4, the lower electrode 9 and the like are to be formed in a later step is removed, to expose the base resin layer 2. As a method of removing the lyophobic layer 15, laser abrasion is suitable. Image formation of a mask pattern in an optical system using a short-wavelength excimer laser as a light source, drawing through an optical modulation element, or the like may be performed to irradiate a predetermined pattern. Here, a KrF excimer laser having a wavelength of 248 nm was used.

For the base resin layer 2, a material which absorbs an irradiating laser wavelength to perform the abrasion is selected. The ink in a base material preferably has a small contact angle, but even when the angle is large, the lyophobic layer may be used as a mask and subjected to a $UV/O_3$ treatment to make the layer lyophilic. The fluorine-based lyophobic layer has a high resistance to UV light having a wavelength of 185 nm in a low pressure mercury lamp and to ozone to be generated, and lyophobic properties can be maintained for a period of time of a treatment required to make the base resin layer 2 lyophilic. As the lyophilic treatment, a plasma treatment, deep UV light irradiation or the like may be used. To process the lyophobic layer 15, it is possible to use a method in which a resist is applied, exposed and developed and the layer is processed with oxygen plasma or the like by use of the resist as a mask. The resist is easily made highly sensitive, and hence it is possible to use a direct drawing exposure machine to measure a substrate deformation and perform correcting exposure, a magnification conversion projection type exposure machine, or the like.

Figure 3A:
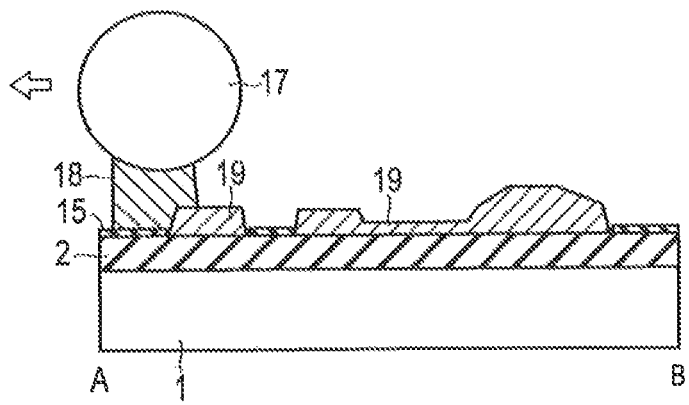
FIGS. 3A, 3C and 3E are sectional views of the manufacturing method of the electronic device.
Figure 3B:
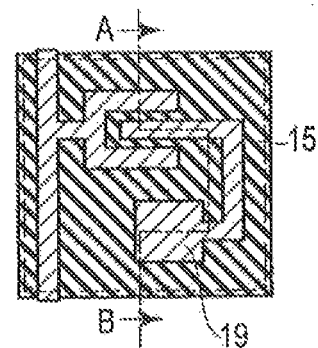
FIGS. 3B, 3D and 3F are plan views corresponding to the sectional views.

To the substrate on which the lyophobic/lyophilic pattern 16 shown in FIG. 2E can be obtained, as shown in FIGS. 3A and 3B, the conductive ink 19 is applied. As an application method, it is possible to use a coating such as applicator coating in which the conductive ink 18 is held between an applicator 17 and the substrate 1 to apply the conductive ink 19, dip coating or capillary coating. Flexographic printing, gravure printing, ink jet printing or the like may be used. Here, a meniscus of the conductive ink 18 was formed between the applicator 17 and the substrate 1 to coat the substrate while moving the applicator.

As the conductive ink, a water-based ink is suitable because the contact angle of the ink increases. For example, when a nanoparticulate conductive material including Ag nanoparticles dispersed in the conductive ink is used, a fine pattern and a low resistance are suitably realized. The conductive ink 18 may include a solvent for regulation of dryness properties, surface tension or the like. The ink applied to the lyophobic layer 15 moves, and the conductive ink 19 remains in a lyophilic portion (the lyophobic/lyophilic pattern 16).

Figure 3C:
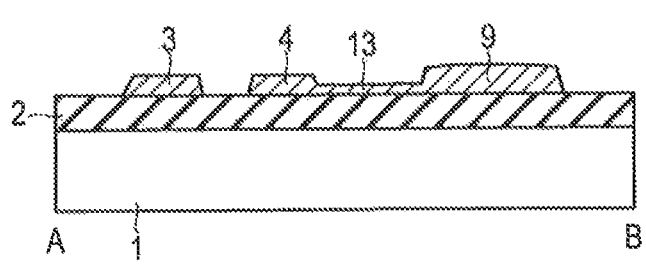
Figure 3D:
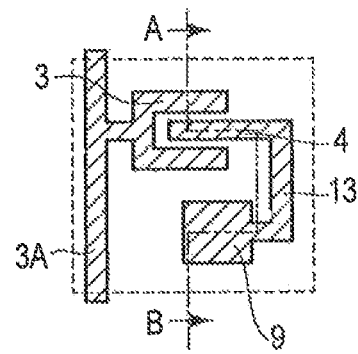

Next, as shown in FIGS. 3C and 3D, the conductive ink 19 is fired to obtain the source electrode 3, the drain electrode 4, the lower electrode 9 and the connecting wiring line 13. Furthermore, in a step of forming these electrodes, a signal line 3A and the like are also formed. The lyophobic layer 15 may be left, or removed by the plasma treatment or the like.

As described above, when the conductive ink is applied by utilizing the lyophobic/lyophilic pattern, a film thickness of the conductive ink can be controlled in accordance with a width of the pattern or a peripheral layout. The lower electrode 9, the source electrode 3 and the drain electrode 4 are preferably formed in larger thicknesses. The film thickness of the lower electrode 9 may be from 100 to 1000 nm, and is preferably 300 nm or more. In particular, the lower electrode 9 may be formed to be thicker than the connecting wiring line 13. In the layout shown in FIG. 3D, the width of the lower electrode 9 is enlarged as compared with the connecting wiring line 13 and the drain electrode 4. In consequence, the lower electrode 9 is formed to have a larger film thickness than the connecting wiring line 13.

To form the pattern shown in FIGS. 3C and 3D, a method (lyophobic/lyophilic printing) of printing the lyophobic/lyophilic pattern 16 with the conductive ink is used, but the present embodiment is not limited to this system. Additionally, it is also possible to use so-called reverse-offset printing in which an ink is applied to a blanket, dried and brought into contact with a relief plate to remove, from the blanket, the half-dried ink in contact with the plate, and the residual ink is transferred to the substrate. In the reverse-offset printing, the drying is controlled by using an alcohol-based ink.

The conductive ink in which the nanoparticles are dispersed is suitably used in the printing, because the conductive ink has a low resistivity and can form the fine pattern. In the nanoparticles used herein, a protective layer is formed in an outer peripheral portion of each of the nanoparticles so that the particles do not adhere or agglomerate to one another. In the protective layer, there is used an organic material (including long-chain molecules) which can be removed at a low temperature.

Furthermore, an additive to stabilize the dispersion of the nanoparticles in the conductive ink 18 and the like are included in the solvent of the conductive ink. These components are originally preferably removable completely, but generation of residual components cannot be avoided especially in a type of ink to be fired at a low temperature of about 150° C. or less. Therefore, it is necessary to consider a constitution of the device so that the influence does not raise any problems. A measure to after-mentioned finding of a problem is one of those which are to be provided by the present application.

Figure 3E:
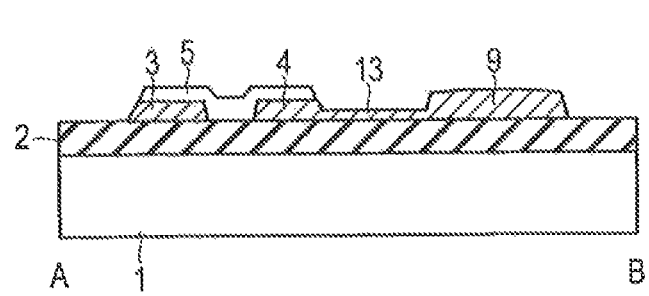
Figure 3F:
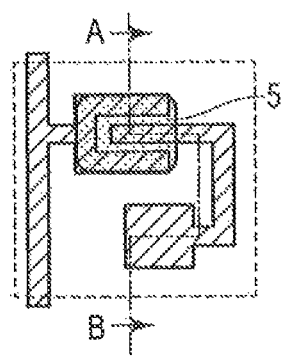

Next, as shown in FIGS. 3E and 3F, the semiconductor layer 5 is formed on the source electrode 3, on the drain electrode 4 and between the source electrode 3 and the drain electrode 4. Here, a polymer-based organic semiconductor was applied by ink jet. Regarding the polymer-based organic semiconductor, a resistance to the solvent can be improved after baking, and options of formation of the gate insulating layer on the semiconductor layer 5 increase. When the semiconductor layer 5 and the gate insulating layer are appropriately combined, even a low molecular material or a high molecular-low molecular blend-based material can be applied to the semiconductor layer 5. Another method, such as flexographic printing, may be used in the formation of the semiconductor layer 5.

Figure 4A:
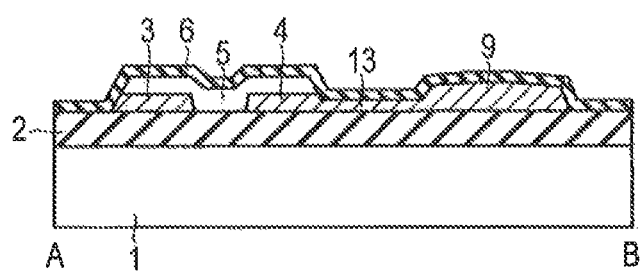
FIGS. 4A, 4C and 4E are sectional views of the manufacturing method of the electronic device.
Figure 4B:
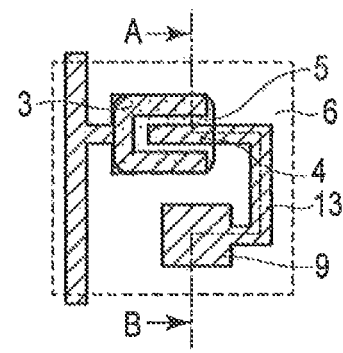
FIGS. 4B, 4D and 4F are plan views corresponding to the sectional views.

On a structure shown in FIGS. 3E and 3F, as shown in FIGS. 4A and 4B, the first gate insulating layer 6 is formed. The first gate insulating layer 6 is made of a non-photosensitive resin, and this insulating layer material is suitably a polystyrene-based material. A dielectric constant of the first gate insulating layer 6 is a slightly lower constant of about 2 to 3. The insulating layer having this degree of dielectric constant has less polarization and lower trap level and possesses suitable insulating characteristics. The first gate insulating layer 6 may be made of a fluorine-containing material. Polyvinyl phenol (PVP) or the like is applicable.

Furthermore, in the first gate insulating layer 6, polyimide, partially fluorinated resin or the like is usable. When the polymer-based organic semiconductor is used in the semiconductor layer 5, a PGMEA solvent (propylene glycol monomethyl ether acetate) is usable in the first gate insulating layer 6, so that options of the material or the ink can easily be regulated and a process applicability can suitably be obtained. When the material is diluted with the solvent to regulate solid components and the material is applied by die coating or the like, dried and baked, the material can suitably be applied to a 100 nm thin film. The first gate insulating layer 6 is suitably formed in a film thickness of 50 to 200 nm. The solvent which is not damaged by the semiconductor material included in the semiconductor layer 5 may be used, and a fluorine-based solvent is also usable. The non-photosensitive resin especially preferably does not include a photoacid generator.

Figure 4C:
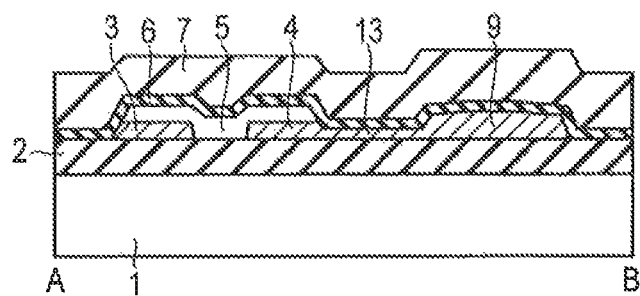
Figure 4D:
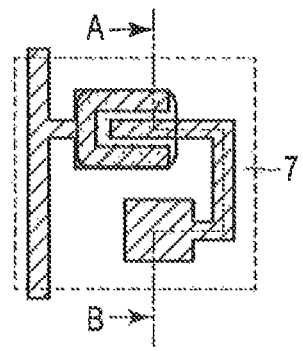
Figure 4E:
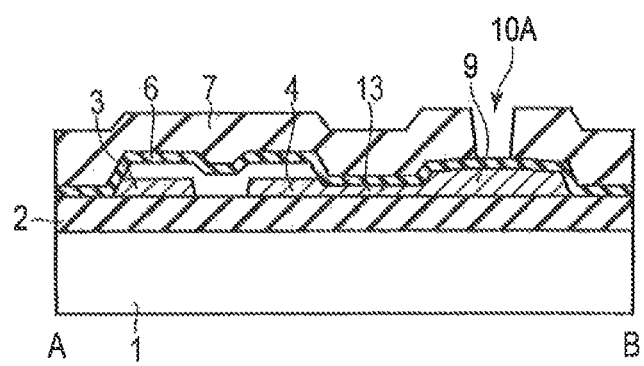
Figure 4F:
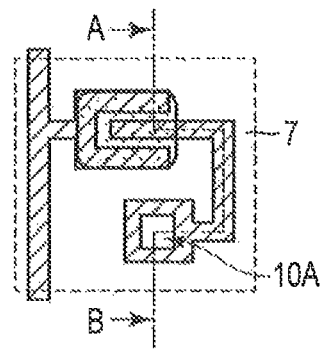

On the first gate insulating layer 6, as shown in FIGS. 4C and 4D, the second gate insulating layer 7 is formed. A photosensitive resin is used in the second gate insulating layer 7. Here, the photosensitive resin was applied by the die coating, spin coating or the like, and dried. Subsequently, the photosensitive resin was irradiated with ultraviolet rays and developed to form the through hole 10A as shown in FIGS. 4E and 4F. The photosensitive resin is especially preferably a chemical amplification type of photosensitive resin in which the photoacid generator to generate the acid when irradiated with light is used and which is reacted with the generated acid and dissolved with an alkaline developing solution. As the photoacid generator, the abovementioned material is usable. The photosensitive resin is suitably a positive type in which an exposed portion irradiated with light is dissolved in the developing solution. The positive type has characteristics that the semiconductor layer is not damaged by the ultraviolet rays, a resolution is high, and a sensitivity can be increased. It is to be noted that a negative type may be used.

Additionally, the inventor has confirmed that when the chemical amplification type of photosensitive resin is directly formed on the lower electrode made of the nanoparticulate conductive material and the photosensitive resin is exposed and developed, the through hole does not reach the surface of the lower electrode sometimes. It has also been found that this phenomenon remarkably appears when a water-based or an alcohol-based low temperature firing type of ink including Ag nanoparticles is used as the nanoparticulate conductive material. It has been found that this is because a protective material included as a raw material of the abovementioned nanoparticulate conductive material or a residual substance of the dispersion stabilizing material is dispersed in the photosensitive resin to hinder photochemical reactions (a photoacid generating reaction and the subsequent reaction by heating or the like to obtain a development solubility).

In the present application, the first gate insulating layer 6 is inserted between the lower electrode (the nanoparticulate conductive material) 9 and the second gate insulating layer (the photosensitive resin) 7. In consequence, it has been found that the first gate insulating layer 6 blocks dispersion of a reaction hindering substance from the nanoparticulate conductive material, and the through hole 10A can be formed down to the first gate insulating layer 6 as shown in FIGS. 4E and 4F. Furthermore, when the first gate insulating layer 6 is inserted, it is possible to inhibit excessive mixing of the photoacid generator, which would deteriorate the insulation characteristics of the second gate insulating layer 7, and also inhibit adverse effects on the semiconductor layer 5 made of the organic semiconductor.

Figure 5A:
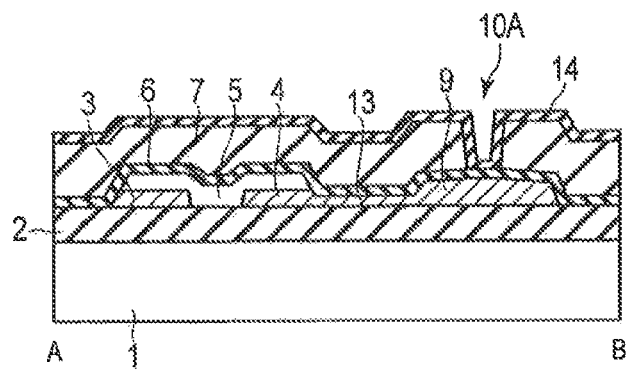
FIGS. 5A and 5C are sectional views of the manufacturing method of the electronic device.
Figure 5B:
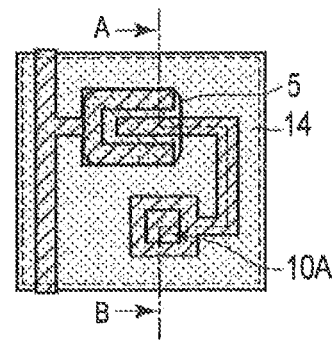
FIGS. 5B and 5D are plan views corresponding to the sectional views.

Subsequently, as shown in FIGS. 5A and 5B, a lyophobic layer 14 is formed on the second gate insulating layer 7 and in the through hole 10A. Here, the fluorine-containing gas is suitably subjected to discharge decomposition to form the fluorine-containing lyophobic layer 14 on the second gate insulating layer 7 and in the through hole 10A. At this time the lower electrode 9 is covered by the first gate insulating layer 6 and therefore is not corroded. In particular, in the case of Ag, high corrosion is observed, and the substance is effectively protected. When a fluoride remains, there is, for example, the problem that when the conductive ink including the nanoparticles is applied during the later printing formation of the upper electrode 11, an abnormal reaction occurs to raise the layer. Furthermore, when the surface of the resin layer 2 is lightly etched by oxygen plasma prior to fluorine plasma, the lyophobic layer 15 is more suitably formed easily. For example, in this case, oxidation of the surfaces of the source electrode 3, the drain electrode 4 and the lower electrode 9 also becomes a problem. When the first gate insulating layer 5 is disposed, the oxidation of these electrode surfaces can be inhibited. It is to be noted that in addition to the plasma forming film of the fluorine-containing gas, a fluorine-containing resin such as the amorphous fluorine resin can be applied to form the film.

Figure 5C:
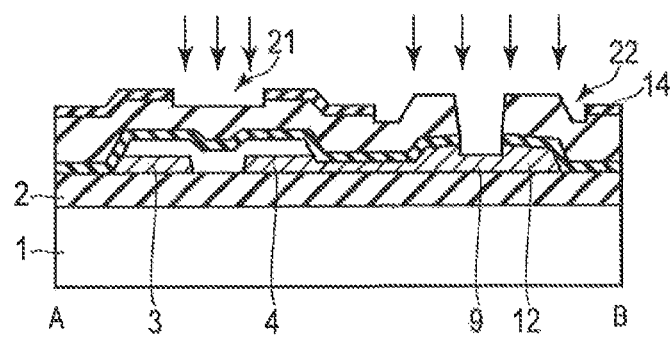
Figure 5D:
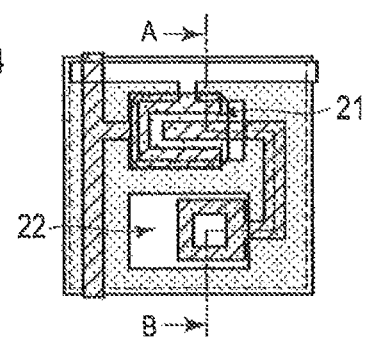

Next, the lyophobic layer 14 is processed in a predetermined pattern, to remove the lyophobic layer 14 as shown in FIGS. 5C and 5D. A lyophobic/lyophilic pattern 21 corresponding to the gate electrode 8 and a lyophobic/lyophilic pattern 22 corresponding to the upper electrode 11 are formed. The lyophobic/lyophilic patterns 21 and 22 are patterns obtained by removing the lyophobic layer 14. For the removal of the lyophobic layer 14, the laser abrasion is suitable. Here, the lyophobic layer 14 was removed by the abrasion, while slightly cutting the second gate insulating layer 7 by the irradiation with the KrF excimer laser having a wavelength of 248 nm.

In the same manner as described above, the lyophobic layer 14 can be processed by using a resist mask. When the contact angle of the conductive ink on the surface of the second gate insulating layer is large, the lyophilic treatment may be performed with UV/$O_3$ or the like by use of the lyophobic layer 14 as the mask. The fluorine-containing lyophobic layer is not easily decomposed by ultraviolet rays of 185 nm, and also has a resistance to $O_3$, so that the surfaces of the patterns 21 and 22 can be made lyophilic without noticeably decreasing the contact angle of the conductive ink on the lyophobic layer. The process during the formation of the lower electrode 9 can similarly be performed.

Furthermore, the first gate insulating layer 6 on the surface of the lower electrode 9 is removed by the abrasion, and hence the through hole is completed. The lower electrode 9 is made of the conductive material and absorbs light having a wavelength of 248 nm, and hence a surface region of the lower electrode 9 is cut to form a concave portion 12. When the thickness of the lower electrode 9 is enlarged, the thickness can be set so that the portion does not pass through the lower electrode, but even when the portion passes through the lower electrode, a side surface of the lower electrode can be connected. It is to be noted that the wavelength of the laser may be short or long in accordance with the material of the lyophobic layer 14, as long as the wavelength is suitable for the abrasion.

Figure 6A:
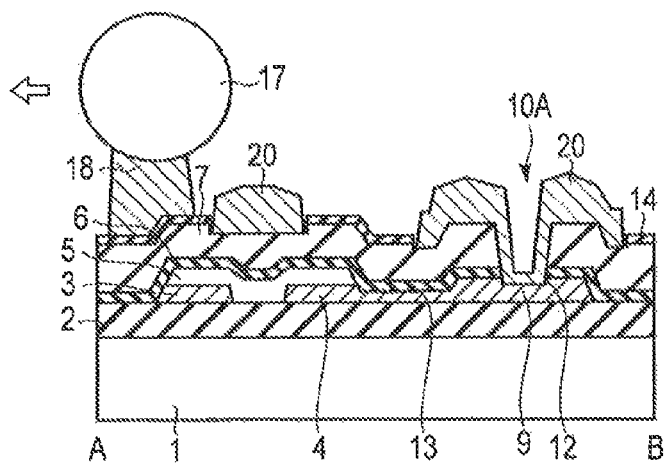
FIGS. 6A and 6C are sectional views of the manufacturing method of the electronic device.
Figure 6B:
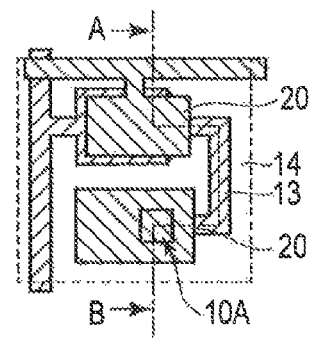
FIGS. 6B and 6D are plan views corresponding to the sectional views.

Next, a conductive ink 20 is applied onto a structure shown in FIGS. 5C and 5D by printing. As a coating application method, it is possible to use applicator coating, in which the conductive ink 18 is held between the applicator 17 and the substrate 1 to apply the conductive ink, dip coating or capillary coating. Flexographic printing, gravure printing, ink jet printing or the like may also be used. Here, the meniscus of the conductive ink 18 was formed between the applicator 17 and the substrate 1 to coat the substrate while moving the applicator as shown in FIGS. 6A and 6E.

A water contact angle of the lyophobic layer 14 is 90° or more, and a contact angle of 70° or more can be obtained to the conductive ink. A contact angle of 30° or less can be obtained to the lyophilic portion (the lyophobic/lyophilic patterns 21 and 22). As the conductive ink 18, a water-based ink is suitable, because the contact angle of the ink is large. For example, when the nanoparticulate conductive material including the Ag nanoparticles dispersed in the conductive ink is used, the fine pattern and low resistance are suitably realized. The conductive ink 18 may include the solvent to regulate the dryness properties, surface tension or the like. The ink applied to the lyophobic layer 14 moves, and the conductive ink 20 remains in the lyophilic portion (the lyophobic/lyophilic patterns 21 and 22).

The conductive ink 18 is applied in the form of a liquid, and hence the ink enters the through hole 10A, so that electrical connection to the side surface of the concave portion 12 of the lower electrode 9 is also acquired. As the conductive ink, a nanoparticulate dispersion-based ink is suitable, because electrical connection can suitably be obtained even with the fine pattern and the fine through hole.

Figure 6C:
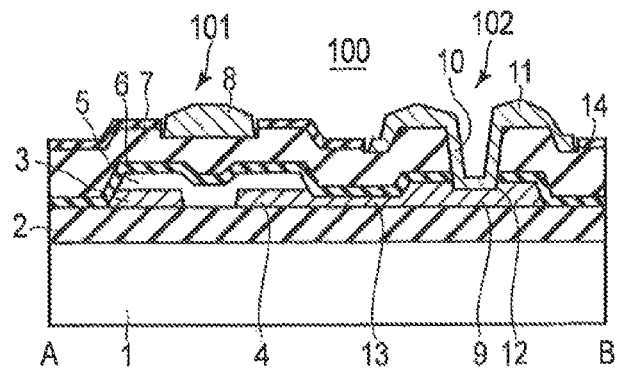
Figure 6D:
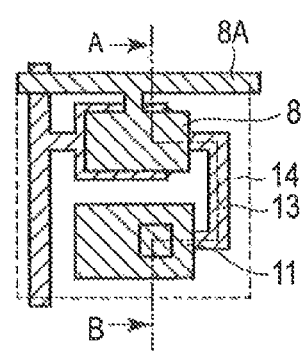

Next, as shown in FIGS. 6C and 6D, the conductive ink 20 is fired to form a conductive pattern such as the gate electrode 8, the upper electrode 11 or a gate line 8A. As described above, the structure of the first embodiment is realized.

Figure 7A:
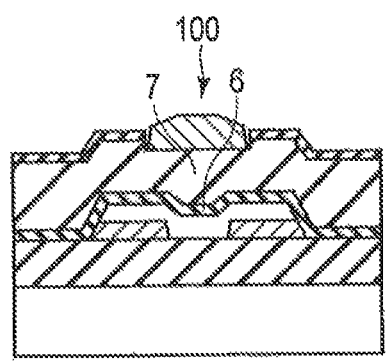
FIG. 7A is a sectional view of the electronic device of the first embodiment.
Figure 7B:
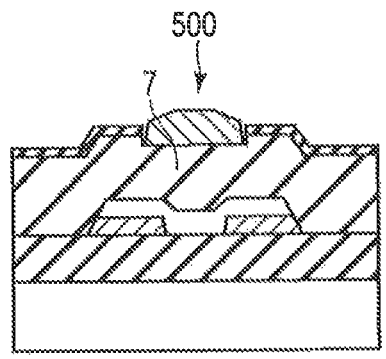
FIG. 7B is a sectional view of an electronic device of a comparative example.

An effect of the present embodiment will be described with reference to FIGS. 7A, 7B, 8 and 9. For comparison, the TFT 100 of the first embodiment and a TFT 500 of a structure where a first gate insulating layer is not present are formed. FIG. 7A is a sectional view of the TFT 100 of the first embodiment and FIG. 7E is a sectional view of the TFT 500 of a comparative example where the first gate insulating layer 6 is omitted.

Figure 8:
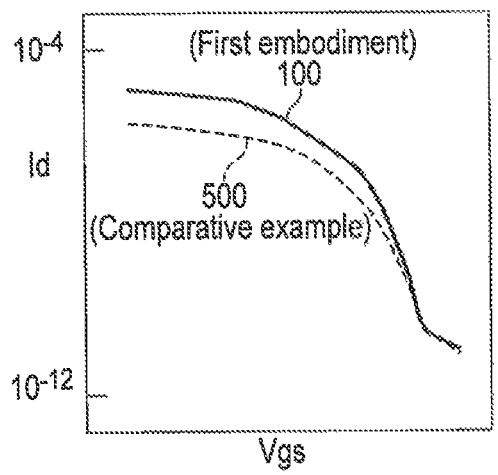
FIG. 8 is a diagram showing Id-Vgs characteristics of the first embodiment and the comparative example.
Figure 9:
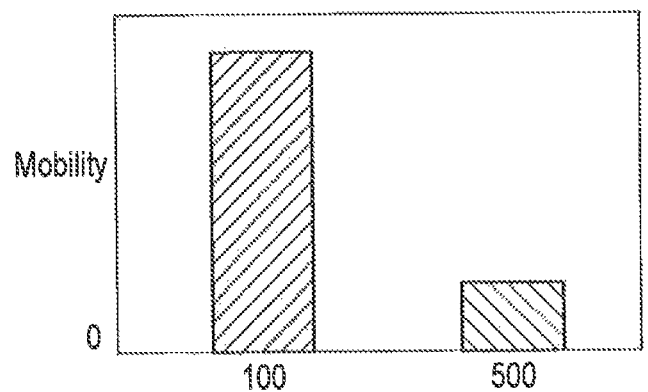
FIG. 9 is a diagram showing mobilities of saturated regions of the first embodiment and the comparative example.

FIGS. 8 and 9 show evaluations of TFT characteristics related to these structures. FIG. 8 shows Id-Vgs characteristics (transfer characteristics) of the first embodiment and the comparative example. As can be seen, in the structure of the first embodiment, a larger on-current can be obtained as compared with the comparative example.

FIG. 9 shows a graph obtained by calculating mobility degrees of saturated regions in the first embodiment and the comparative example. It has been seen that a mobility of 0.2 to 0.6 cm$^2$/Vs can be obtained in the structure of the first embodiment, whereas the mobility degree lowers to ⅓ to ⅕ in the structure of the comparative example. It is considered that this is because a material component which imparts a photosensitivity included in the photosensitive resin deteriorates the characteristics.

Furthermore, it is considered that when the source electrode and drain electrode made of the nanoparticulate conductive material are used, the characteristics are influenced by an interaction between a material component for the dispersion of the nanoparticles and the material component to impart the photosensitivity, in the first embodiment, the first gate insulating layer 6 has a small thickness of about 100 nm and a low dielectric constant of 2.4 to 2.7, but the second gate insulating layer 7 has a large dielectric constant of 3.3 to 3.8. Therefore, an entire gate capacitance enlarges, and the on-current can be increased as compared with a case where the gate insulating layer having the same film thickness is formed only by using the first gate insulating layer, whereby a transistor having a high current driving capability can be obtained.

Furthermore, FIGS. 10A and 10B show configurations in a case where through holes are formed in the first embodiment and the comparative example, respectively. In the case of the comparative example 500, i.e., in a case where a first gate insulating layer to non-photosensitive resin) 6 is not disposed on a lower electrode 9, but a second gate insulating layer (a chemical amplification type of photosensitive resin) 7 is only disposed thereon and a through hole 10A is formed, the configuration shown in FIG. 10E is obtained. As described above, in the comparative example 500, a depth at which the through hole is opened is only from 40 to 50% of a film thickness of the gate insulating layer, and an incomplete opening is made.

It is to be noted that when the lower electrode 9 is formed of an Ag film by sputtering, the through hole 10A does not become an incomplete opening, and even when the photosensitive resin is formed directly on the lower electrode 9, the opening reaches the surface of the lower electrode 9. Therefore, it has been confirmed that the development, is hindered because the nanoparticulate conductive material is used. It has been seen that the depth of the opening of the through hole varies with the type of conductive ink and the manufacturer of the conductive ink and that even a portion where no opening is present is influenced by a certain material. In the first embodiment, the first gate insulating layer (the non-photosensitive resin) is interposed between the lower electrode and the second gate insulating layer (the photosensitive resin), and also in this case, the through hole can be opened by the exposure and development until the opening reaches the non-photosensitive resin.

The film thickness of the first gate insulating layer is a film thickness required to inhibit the dispersed substance from the nanoparticulate conductive material, and may be from 20 to 200 nm. The film thickness of the photosensitive resin of the second gate insulating layer can be from 100 nm to 3 μm. A film thickness ratio between the first gate insulating layer and the second gate insulating layer may be 1:2 or more and may be from 1:2 to 1:20. A film thickness of the lower electrode (the nanoparticulate conductive material) may be from 50 to 1000 nm, and when the film thickness of the lower electrode enlarges, the film thickness of the first gate insulating layer is enlarged to more effectively inhibit the dispersed substance.

As described above, according to the first embodiment, interface characteristics between the semiconductor layer and the gate insulating layer are suitably obtained, and the characteristics of the thin film transistor, especially the on-current can be improved. Furthermore, the fine through hole for the interlayer connection to connect the lower electrode to the upper electrode can be formed, and a high-performance electronic device can be manufactured at low cost.

Second Embodiment

FIG. 11 is a sectional view of an electronic device of a second embodiment.

In the second embodiment, there will be illustrated a structure in a case where abrasion is used in a step of patterning a lyophobic layer 15 when a source electrode 3, a drain electrode 4, a lower electrode 9 and a connecting wiring line 13 are formed on a resin layer 2. A constitution common with the first embodiment is denoted with common reference symbols and description thereof is omitted.

As shown in FIG. 11, a pattern of the lyophobic layer 15 is formed on the resin layer 2, and a concave portion formed by the abrasion can be made in the surface of the resin layer 2 where the lyophobic layer 15 is not disposed. Furthermore, a portion made more concave by the abrasion is present in the resin layer 2 under a through hole conductive film 10. The portion with increased concavity may be formed in another abrasion step. In the concave portion of the resin layer 2 where the lyophobic layer 15 is not formed, the source electrode 3, the drain electrode 4 and the lower electrode 9 are formed. The lower electrode 9 further has a lower layer portion 9A in the increased concavity portion of the resin layer 2 which corresponds to a through hole 10A. The remaining constitution is similar to the abovementioned first embodiment.

Similarly to the first embodiment, the source electrode 3, the drain electrode 4, the lower electrode 9 and the connecting wiring line 13 are formed by printing with a conductive ink. As a printing method, the abovementioned meniscus application or capillary application is usable. At this time, a layout may be contrived so that the conductive ink easily remains in a portion where the above electrodes are to be formed. In consequence, a thickness of the lower electrode 9 further enlarges, and can be set so that a concave portion 12 of the lower electrode 9 does not pass through the lower electrode 9 by the abrasion to process the lyophobic layer 15 for formation of an upper electrode 11.

The lyophobic layer 15 is left between the source electrode 3 and the drain electrode 4, whereby characteristics on a back channel side of a TFT can be controlled, and hence an effect of reducing an off-current can be obtained. It is to be noted that the lyophobic layer 15 between the source electrode 3 and the drain electrode 4 may be removed.

According to the second embodiment, similarly to the first embodiment, interface characteristics between the semiconductor layer and the gate insulating layer are suitably obtained, and characteristics of the thin film transistor, especially an on-current can be improved. Furthermore, a fine through hole for interlayer connection to connect the lower electrode to the upper electrode can be formed, and a high-performance electronic device can be manufactured at low cost. Additionally, the thickness of the lower electrode 9 can be enlarged, and hence the thickness can be set so that the concave portion 12 of the lower electrode 9 does not pass through the lower electrode 9, by the abrasion to process the lyophobic layer 15 for the formation of the upper electrode 11.

Third Embodiment

FIG. 12 is a sectional view of an electronic device of a third embodiment.

In the third embodiment, there will be illustrated a structure in a case where in a step of forming a source electrode 3, a drain electrode 4, a lower electrode 9 and a connecting wiring line 13 on a resin layer 2, the source electrode 3, the drain electrode 4, the lower electrode 9 and the connecting wiring line 13 are formed by reverse-offset printing. A constitution common with the first embodiment is denoted with common reference symbols and description thereof is omitted.

As shown in FIG. 12, the source electrode 3, the drain electrode 4, the lower electrode 9 and the connecting wiring line 13 are formed on the resin layer 2 by the inversion printing. Therefore, no concave portion is formed in the surface of the resin layer 2 on which the source electrode 3, the drain electrode 4, the lower electrode 9 and the connecting wiring line 13 are formed. Reverse-offset printing is a printing method in which ink is applied onto a blanket of polydimethylsiloxane (PDMS) or the like, and the ink is semi-dried and brought into contact with a concavoconvex plate to remove the ink of a contact surface from the blanket. Furthermore, the ink which remains on the blanket is transferred to a substrate.

In the inversion printing, film thicknesses of the source electrode 3, the drain electrode 4, the lower electrode 9 and the connecting wiring line 13 can be uniformed, and hence a sectional shape similar to that of each electrode formed by lithography can be obtained. On the other hand, the film thickness cannot be increased by much, hence a through hole 10A passes through the lower electrode 9 sometimes by abrasion of a lyophobic layer 14 during formation of an upper electrode 11.

FIG. 12 shows such a configuration, and the through hole 10A which passes through the lower electrode 9 is formed. Also in this case, when a conductive ink is applied to form the upper electrode 11, the conductive ink enters the through hole 10A, and is brought into contact with a through hole conductive film 10 of a side surface of the through hole 10A to obtain electrical connection between the lower electrode 9 and the upper electrode 11.

According to the third embodiment, similarly to the first embodiment, interface characteristics between the semiconductor layer and the gate insulating layer are suitably obtained, and characteristics of a thin film transistor, especially an on-current can be improved. Furthermore, a fine through hole for interlayer connection to connect the lower electrode to the upper electrode can be formed, and a high-performance electronic device can be manufactured at low cost.

It is to be noted that in the formation of the source electrode 3, the drain electrode 4, the lower electrode 9 and the connecting wiring line 13, in addition to reverse-offset printing, gravure printing, gravure offset printing or the like may be used.

According to the abovementioned embodiments, there can be provided a high-performance electronic device which is capable of improving characteristics of a thin film transistor and forming a fine through hole, and a manufacturing method which is capable of manufacturing the electronic device at low cost.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A manufacturing method of an electronic device comprising a lower electrode, a source electrode and a drain electrode made of a nanoparticulate conductive material on a substrate, comprising an organic semiconductor layer between the source electrode and the drain electrode, and comprising a gate electrode on the organic semiconductor layer via a gate insulating layer, the method comprising:
    forming a non-photosensitive resin layer as the gate insulating layer on the organic semiconductor layer and the lower electrode;
    forming a photosensitive resin layer as the gate insulating layer on the non-photosensitive resin layer;
    forming a through hole in the photosensitive resin layer on the lower electrode, and
    forming the gate electrode on the photosensitive resin layer on the non-photosensitive resin layer on the organic semiconductor layer between the source electrode and the drain electrode without removing the photosensitive resin layer.

2. The method according to claim 1,
    wherein the forming of the through hole comprises steps of exposing, developing and curing the photosensitive resin layer.

3. The method according to claim 1,
    wherein the forming of the lower electrode, the source electrode and the drain electrode comprises:
    forming a lyophobic layer on a resin layer which is present on the substrate, and patterning the lyophobic layer; and
    making the resin layer lyophilic by use of the lyophobic layer as a mask, and then printing with a conductive ink on the resin layer to form the lower electrode, the source electrode and the drain electrode.

4. The method according to claim 1,
    wherein the photosensitive resin layer has a photoacid generator which generates an acid when irradiated with light.

5. The method according to claim 4,
    wherein the photoacid generator includes at least one of a triarylsulfonium salt series, naphthalene imide series, thioxanthone derivatives, triazines, nitrobenzylesters, diazomethanes and onium salts.

6. The method according to claim 1,
    wherein the nanoparticulate conductive material includes Ag nanoparticles.

7. A manufacturing method of an electronic device comprising a lower electrode, a source electrode and a drain electrode made of a nanoparticulate conductive material on a substrate, comprising an organic semiconductor layer between the source electrode and the drain electrode, and comprising a gate electrode on the organic semiconductor layer via a gate insulating layer, the method comprising:
    forming a non-photosensitive resin layer as the gate insulating layer on the organic semiconductor layer and the lower electrode;
    forming a photosensitive resin layer as the gate insulating layer on the non-photosensitive resin layer;
    forming a through hole in the photosensitive resin layer on the lower electrode;
    forming a lyophobic layer on the photosensitive resin layer and on the non-photosensitive resin layer, after the through hole is formed in the photosensitive resin layer;
    patterning the lyophobic layer to remove the lyophobic layer in a region where the gate electrode and the upper electrode are to be formed, and to remove the non-photosensitive resin layer in a bottom portion of the through hole together with the lyophobic layer; and
    printing with a conductive ink on the photosensitive resin layer, in the through hole and on the lyophobic layer, to form the gate electrode and to form the upper electrode on the photosensitive resin layer which is present on the lower electrode.

8. The method according to claim 7,
    wherein the lyophobic layer is formed by subjecting a fluorine-containing gas to discharge decomposition.

9. The method according to claim 7,
    wherein the patterning of the lyophobic layer is performed by laser abrasion.

10. An electronic device comprising:
    a lower electrode, a source electrode and a drain electrode made of a nanoparticulate conductive material formed on a substrate;
    an organic semiconductor layer formed between the source electrode and the drain electrode;
    a gate insulating layer comprising a non-photosensitive resin layer formed on the organic semiconductor layer and on the lower electrode, and a photosensitive resin layer formed on the non-photosensitive resin layer;
    a gate electrode formed on the photosensitive resin layer on the non-photosensitive resin layer on the organic semiconductor layer between the source electrode and the drain electrode;
    an upper electrode formed on the photosensitive resin which is present on the lower electrode; and
    a conductive film formed in the gate insulating layer on the lower electrode to electrically connect the lower electrode to the upper electrode.

11. The electronic device according to claim 10,
    wherein the photosensitive resin layer has a photoacid generator which generates an acid when irradiated with light.

12. The electronic device according to claim 11,
    wherein the photoacid generator includes at least one of a triarylsulfonium salt series, naphthalene imide series, thioxanthene derivatives, triazines, nitrobenzylesters, diazomethanes and onium salts.

13. The electronic device according to claim 10,
    wherein the upper electrode comprises a nanoparticulate conductive material.

14. The electronic device according to claim 13,
    wherein the nanoparticulate conductive material comprises Ag nanoparticles.

15. The electronic device according to claim 10,
    wherein the upper electrode is a conducive pattern formed by patterning a lyophobic layer on the gate insulating layer to form a lyophobic/lyophilic pattern on the surface of the gate insulating layer, and applying a conductive ink to the lyophobic/lyophilic pattern.

* * * * *